(12) United States Patent
Im et al.

(10) Patent No.: US 9,666,503 B2
(45) Date of Patent: May 30, 2017

(54) SEMICONDUCTOR PACKAGE AND ELECTRONIC SYSTEM INCLUDING THE SAME

(71) Applicant: Samsung Electronics Co., Ltd., Suwon-si (KR)

(72) Inventors: Yun-Hyeok Im, Hwaseong-si (KR); Kyol Park, Daejeon (KR); Hee-Jung Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 698 days.

(21) Appl. No.: 14/104,435

(22) Filed: Dec. 12, 2013

(65) Prior Publication Data

US 2014/0254092 A1 Sep. 11, 2014

(30) Foreign Application Priority Data

Mar. 11, 2013 (KR) .................. 10-2013-0025584

(51) Int. Cl.
*G01J 5/00* (2006.01)
*G01K 1/00* (2006.01)
(Continued)

(52) U.S. Cl.
CPC .............. *H01L 23/34* (2013.01); *H01L 23/36* (2013.01); *H01L 23/49816* (2013.01); *H01L 25/105* (2013.01); *H01L 25/18* (2013.01); *H01L 23/145* (2013.01); *H01L 23/49827* (2013.01); *H01L 2224/16145* (2013.01); *H01L 2224/16227* (2013.01); *H01L 2224/17181* (2013.01); *H01L 2224/32145* (2013.01); *H01L 2224/48091* (2013.01); *H01L 2224/73253* (2013.01); *H01L 2224/73265* (2013.01); *H01L 2225/06513* (2013.01); *H01L 2225/06541* (2013.01); *H01L 2225/06589* (2013.01); (Continued)

(58) Field of Classification Search
USPC ................................. 374/121, 179, 208, 141
See application file for complete search history.

(56) References Cited

U.S. PATENT DOCUMENTS 4,278,867 A * 7/1981 Tan ...................... B23K 1/0056
148/DIG. 93
4,754,141 A * 6/1988 Mindock ............. H01L 33/0004
250/343

(Continued)

FOREIGN PATENT DOCUMENTS

JP 08083880 3/1996
KR 1020010038316 5/2001
(Continued)

*Primary Examiner* — Mirellys Jagan
(74) *Attorney, Agent, or Firm* — Onello & Mello, LLP

(57) ABSTRACT

A semiconductor package and an electronic system including the same include a package board having an electric circuit pattern. A semiconductor chip is mounted on the package board and electrically connected with the circuit pattern of the package board. A non-contact temperature detector is provided with the semiconductor package and detects a temperature of an external heat source without making contact with the external heat source. A temperature controller controls the semiconductor chip according to the temperature of the external heat source that is detected by the non-contact temperature detector.

20 Claims, 8 Drawing Sheets

(51) Int. Cl.
  *G01K 7/00* (2006.01)
  *H01L 23/34* (2006.01)
  *H01L 23/36* (2006.01)
  *H01L 23/498* (2006.01)
  *H01L 25/10* (2006.01)
  *H01L 25/18* (2006.01)
  *H01L 23/14* (2006.01)

(52) U.S. Cl.
  CPC ........... *H01L 2225/1023* (2013.01); *H01L 2225/1058* (2013.01); *H01L 2225/1094* (2013.01); *H01L 2924/15184* (2013.01); *H01L 2924/15311* (2013.01); *H01L 2924/15331* (2013.01); *H01L 2924/181* (2013.01); *H01L 2924/18161* (2013.01)

(56) References Cited

U.S. PATENT DOCUMENTS

| | | | | |
|---|---|---|---|---|
| 5,600,174 | A * | 2/1997 | Reay | G01F 1/6845 257/401 |
| 5,763,885 | A * | 6/1998 | Murphy | G01J 5/061 250/332 |
| 5,844,208 | A * | 12/1998 | Tustaniwskyj | G01R 31/2874 165/80.2 |
| 6,251,706 | B1 * | 6/2001 | Paniccia | H01L 23/373 257/706 |
| 6,297,995 | B1 | 10/2001 | McConnell et al. | |
| 7,855,397 | B2 * | 12/2010 | Alley | H01L 23/38 136/203 |
| 7,891,064 | B2 * | 2/2011 | Kang | B41J 2/055 29/25.35 |
| 8,013,431 | B2 | 9/2011 | Lee | |
| 8,192,082 | B2 | 6/2012 | Song et al. | |
| 8,247,829 | B2 | 8/2012 | Kim | |
| 2002/0139410 | A1 * | 10/2002 | Wilner | G01J 5/12 136/224 |
| 2004/0150933 | A1 * | 8/2004 | Nishigaki | G06F 1/1632 361/103 |
| 2006/0007722 | A1 * | 1/2006 | Nordal | G11C 29/02 365/65 |
| 2006/0075760 | A1 * | 4/2006 | Im | H01L 22/34 62/3.7 |
| 2007/0090337 | A1 * | 4/2007 | Ueno | B82Y 20/00 257/13 |
| 2007/0181650 | A1 * | 8/2007 | Yoo | G01K 17/20 228/101 |
| 2008/0017367 | A1 * | 1/2008 | Yazawa | G01R 31/2874 165/287 |
| 2008/0317087 | A1 * | 12/2008 | Kimura | G01J 5/16 374/1 |
| 2011/0237001 | A1 * | 9/2011 | Hasebe | H01L 25/0657 438/4 |
| 2012/0133427 | A1 | 5/2012 | Kim et al. | |
| 2013/0126508 | A1 * | 5/2013 | Salzman | H05B 1/0233 219/209 |
| 2013/0135823 | A1 * | 5/2013 | Kim | H01L 23/043 361/697 |
| 2013/0259086 | A1 * | 10/2013 | Lane | G01J 5/046 374/121 |
| 2014/0153607 | A1 * | 6/2014 | Chainer | G01K 7/427 374/1 |

FOREIGN PATENT DOCUMENTS

| | | |
|---|---|---|
| KR | 1020080085798 | 9/2008 |
| KR | 1020110077936 | 7/2011 |
| KR | 101159639 | 6/2012 |
| KR | 1020120057285 | 6/2012 |

* cited by examiner

SEMICONDUCTOR PACKAGE AND ELECTRONIC SYSTEM INCLUDING THE SAME

CROSS-REFERENCE TO RELATED APPLICATIONS

This U.S. non-provisional application claims priority under 35 U.S.C. §119 to Korean Patent Application No. 10-2013-0025584, filed on Mar. 11, 2013 in the Korean Intellectual Property Office, the contents of which are incorporated herein by reference in their entirety.

BACKGROUND

1. Field

Example embodiments of the present inventive concepts relate to a semiconductor package and an electronic system including the same. More particularly, the example embodiments of the present inventive concepts relate to a semiconductor package for a mobile system and a mobile electronic system including the same.

2. Description of the Related Art

As recent electronic devices have been highly integrated with high performance, semiconductor packages are also manufactured to have a small size and a high density. The higher performance of the high density semiconductor packages at higher speeds generates a larger quantity of heat in the semiconductor packages. Thus, sufficient thermal dissipation becomes one of the most important factors for increase the operation stability and product reliability of the semiconductor packages and the electronic systems including the semiconductor packages.

Recently, a dynamic thermal management (DTM) tool has been widely used to optimize operation of an electronic system having a semiconductor package. In the conventional DTM process, operation of a semiconductor chip in the electronic system is automatically stopped by temperature control software when an operation temperature of the semiconductor chip is increased over a reference temperature of the electronic system.

In the conventional DTM process for controlling the temperature of the electronic system, a maximal chip temperature, which corresponds to the maximal allowable temperature of a semiconductor chip of the electronic system, and a maximal housing temperature, which corresponds to the maximal allowable temperature of a housing of the electronic system, are usually used as the reference temperatures of the electronic system. Thus, the DTM tool automatically stops the operation of the semiconductor chip immediately when detecting any one of the chip reference temperature and the housing reference temperature during the operation of the electronic system.

When operating the electronic system, the surface temperature of the chip is easily detected by various temperature detection tools. However, when operating the electronic system, the surface temperature of the housing is very difficult to detected within the electronic system. For that reason, the housing reference temperature is usually determined by adding an experimental safety temperature to the detected temperature of the chip. That is, the housing reference temperature is always higher than the chip reference temperature by at least the safety temperature.

Therefore, although the operation temperature of the chip, which is detected by the chip temperature detection tool, is sufficiently lower than the chip reference temperature, the operation temperature of the housing may be determined to be over the housing reference temperature by the DTM tool when the safety temperature is added to the operation temperature of the chip. In such a case, the DTM tool has no choice but to stop the chip operation although an actual heat dissipation of the chip is sufficiently allowable because the operation temperature of the chip is sufficiently lower than the chip reference temperature. As a result, the semiconductor chip in the electronic system is operated below the maximal operation performance, which decreases the operation efficiency of the semiconductor package including the semiconductor chip.

SUMMARY

Example embodiments of the present inventive concepts provide an improved semiconductor package having a temperature detection tool by which a temperature of the housing enclosing a semiconductor package at an exterior of the semiconductor package can be detected as well as the semiconductor chip positioned at an interior of the semiconductor package.

Some example embodiments of the present inventive concepts provide a semiconductor package having a non-contact temperature sensor for detecting a temperature of an object that is positioned at an exterior of the semiconductor package.

Some example embodiments of the present inventive concepts provide an electronic system including the above semiconductor package.

According an aspect of the present inventive concepts, there is provided a semiconductor package including a package board having an electric circuit pattern, a semiconductor chip on the package board and electrically connected with the circuit pattern of the package board, a non-contact temperature detector detecting a temperature of an external heat source without making contact with the external heat source, and a temperature controller controlling the semiconductor chip according to a temperature of the external heat source that is detected by the non-contact temperature detector.

In some embodiments, the non-contact temperature detector may include an infrared ray (IR) responsive thermocouple generating an electromotive force by absorbing infrared radiant heat emitted from the external heat source, a voltmeter connected to the thermocouple and measuring the electromotive force and a detecting unit detecting the temperature of the external heat source from the measured electromotive force.

In some embodiments, the non-contact temperature detector may be integrally provided together with the semiconductor chip in one body.

In some embodiments, a heat slug may be further positioned on the semiconductor chip and dissipating operation heat of the semiconductor chip outwards. The heat slug may have a penetration hole through which the semiconductor chip may be partially exposed in such a way that infrared radiant heat emitted from the external heat source may reaches the non-contact temperature detector through the penetration hole.

In some embodiments, the non-contact temperature detector may be individually provided on the package board and is separated from the semiconductor chip.

In some embodiments, the non-contact temperature detector may include a temperature detection chip for detecting the temperature of the external heat source without making contact with the external heat source such that the temperature detection chip and the semiconductor chip may be electrically connected through the circuit pattern of the package board.

In some embodiments, a heat slug may be further positioned on the semiconductor chip and the temperature detection chip. The heat slug may have a penetration hole through which the temperature detection chip may be partially exposed in such a way that infrared radiant heat emitted from the external heat source may reaches the temperature detection chip through the penetration hole.

In some embodiments, the non-contact temperature detector may include a temperature detection chip for detecting the temperature of the external heat source without making contact with the external heat source such that the temperature detection chip may be positioned on the semiconductor chip and the temperature detection chip and the semiconductor chip may be electrically connected through at least a penetration electrode as a chip stack structure.

In some embodiments, a heat slug may be further positioned on the semiconductor chip and dissipating operation heats of the semiconductor chip outwards and a conductive contact plug electrically connecting the heat slug and the package board, wherein the non-contact temperature detector may be positioned on the heat slug.

In some embodiments, an interposer may be further arranged on the semiconductor chip and electrically connected to the semiconductor chip, wherein the non-contact temperature detector may be positioned on the interposer.

In an example embodiment, a chip temperature detector may be further provided with the semiconductor package for detecting a temperature of the semiconductor chip.

According to another aspect of the present inventive concepts, there is provided an electronic system including a housing having a receiving space in which a mother board is received and a semiconductor package on the mother board. The semiconductor package may a package board having an electric circuit pattern connected to the mother board, a semiconductor chip mounted on the package board and electrically connected to the circuit pattern of the package board, a non-contact temperature detector detecting a temperature of the housing without making contact with the housing, and a temperature controller controlling the semiconductor chip according to the temperature of the housing that is detected by the non-contact temperature detector.

In some embodiments, the non-contact temperature detector may be positioned at at least one of in the semiconductor chip, on an upper surface of the package board and on an upper surface of the semiconductor chip.

In some embodiments, a heat slug may be further positioned on the semiconductor chip and dissipating operation heats of the semiconductor chip outwards and a conductive contact plug electrically connecting the heat slug and the package board, wherein the non-contact temperature detector is positioned on the heat slug.

In some embodiments, the semiconductor chip may include a chip set for an application process (AP) for a mobile system.

According to another aspect of the present inventive concepts, there is provided an electronic system including a package board having an electric circuit pattern, a semiconductor chip on the package board and electrically connected with the circuit pattern of the package board, a housing surrounding the package board and the semiconductor chip, a non-contact temperature detector detecting a temperature of the housing, the non-contact temperature detector being spaced apart from the housing, and a chip temperature detector detecting a temperature of the semiconductor chip.

In some embodiments, the electronic system includes a temperature controller controlling the semiconductor chip according to the temperature of the housing that is detected by the non-contact temperature detector spaced apart from the housing and according to the temperature of the semiconductor chip detected by the chip temperature detector.

In some embodiments, the non-contact temperature detector may include an infrared ray (IR) responsive thermocouple generating an electromotive force by absorbing infrared radiant heat emitted from the external heat source, a voltmeter connected to the thermocouple and measuring the electromotive force and a detecting unit detecting the temperature of the external heat source from the measured electromotive force.

In some embodiments, the electronic system further includes a heat slug positioned on the semiconductor chip and dissipating operation heat of the semiconductor chip outwards, the heat slug having a penetration hole such that infrared radiant heat emitted from the housing reaches the non-contact temperature detector through the penetration hole.

In some embodiments, the non-contact temperature detector is positioned at at least one of in the semiconductor chip, on an upper surface of the package board and on an upper surface of the semiconductor chip.

According to example embodiments of the present inventive concepts, the temperature of a housing or a case enclosing a semiconductor package may be directly detected by a non-contact temperature detector without making contact with the housing or the case. Thus, the DTM process of the semiconductor package may be conducted according to the detected temperature of the housing or the case rather than the assumptive temperature. Thereby, the operation efficiency of the semiconductor chip of the semiconductor package is sufficiently increased.

In a case of a conventional DTM tool, in an application processor (AP) of a mobile system, the case temperature of the mobile system is determined as an assumptive temperature by adding an experimental safety temperature to the detected temperature of the semiconductor chip in the AP. Thus, in a conventional DTM process, when the assumptive temperature of the case is higher than the reference temperature of the case, even though the detected temperature of the semiconductor chip of the AP is sufficiently lower than the reference temperature of the semiconductor chip of the AP, the DTM tool automatically stops the operation of the semiconductor chip of the CPU structure. Thereby, the operation efficiency of the CPU structure is reduced. However, according to the example embodiments of the mobile system of the present inventive concepts, the temperature of the case may be directly detected by a non-contact temperature detector by using infrared radiant heat from the case, and, thus, the DTM tool may be operated according to the detected chip temperature of the AP and, also, according to the detected temperature of the case, rather than the assumptive temperature of the case. Therefore, an automatic stop of the chip operation of the AP in an allowable temperature range may be minimized to thereby increase the operation efficiency of the AP of the mobile system.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENTS

Figure 1:
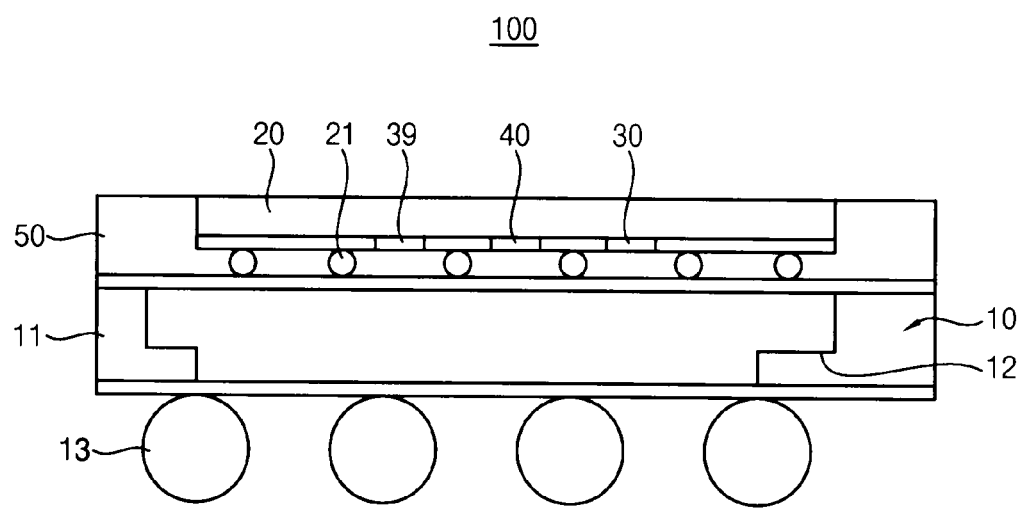
FIG. 1 is a cross-sectional view illustrating a semiconductor package in accordance with an example embodiment of the present inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Hereinafter, example embodiments will be explained in detail with reference to the accompanying drawings.

Semiconductor Package

FIG. 1 is a cross-sectional view illustrating a semiconductor package 100 in accordance with an example embodiment of the present inventive concepts.

Referring to FIG. 1, the semiconductor package 100 in accordance with an example embodiment of the present inventive concepts may include a package board or circuit board 10 having an electrical circuit pattern 12 therein and a semiconductor chip 20 mounted on the package board 10 and electrically connected with the electrical pattern 12 of the package board 10. The semiconductor package 100 may include a non-contact temperature detector 30 which detects a temperature of an external heat source (not shown) without making contact with the external heat source. The semiconductor package 100 may include a temperature controller 40 which controls the semiconductor chip 20 according to an external temperature of the external heat source that is detected by the non-contact temperature detector 30.

In some embodiments, the package board 10 may comprise a plate having a sufficient rigidity and may include the circuit pattern 12 at an upper face and a lower face. For example, the package board 10 may include a body 11 shaped into a sufficiently rigid plate. The body 11 may include insulating and heat-resistive materials. The circuit pattern 12 may be arranged inside the body 11. The circuit pattern 12 may include a plurality of conductive lines and may be connected to a plurality of contact pads (not shown) arranged on the front and the lower faces of the body 11. Contact terminals 13 may be arranged on the contact pads, respectively, at a bottom of the package board 10 and an external contact element (not shown) may make contact with the contact terminals 13. The semiconductor chip 20 may make contact with the contact pads on the upper face of the body 11 and, thus, the semiconductor chip 20 and the external contact element may be electrically connected to each other through the circuit pattern 12 and the contact terminals 13. For example, the contact terminal 13 may include a solder ball.

The body 11 may include, for example, a thermosetting plastic plate such as an epoxy resin plate and/or a polyimide plate. In another embodiment, the body 11 may include a plate on which a heat-resistive organic film, such as, for example, a liquid crystal polyester film and/or a polyamide film, may be coated. The circuit pattern 12 may include a plurality of conductive lines or wirings that may be electrically connected with the semiconductor chip 20 and the external contact elements. The circuit pattern 12 may include a power line for applying an electric power, a plurality of signal lines for communicating data signals with the semiconductor chip 20 and a ground line for electrically grounding the signal lines and the power line. The conductive lines or the wirings of the circuit pattern 12 may be electrically insulated from one another by, for example, a plurality of insulation interlayers (not shown). In the present example embodiments, the package board 10 may include a printed circuit board (PCB) in which the circuit pattern 12 may be formed by, for example, a printing process.

The semiconductor chip 20 may include an active device such as an integrated circuit device mounted on the package board 10. Thus, when the driving power is applied to the semiconductor chip 20, an electrical operation such as an electrical amplification and an electrical oscillation may be conducted and, as a result, driving heat may be generated from the semiconductor chip 20.

For example, the semiconductor chip 20 may include a plurality of conductive structures (not illustrated) stacked on a semiconductor substrate such as a silicon wafer. The conductive structure may be stacked on the semiconductor substrate using a plurality of insulation interlayers and a plurality of wiring structures separated from the conductive structures by the insulation interlayers. The wiring structure may transfer signals to the conductive structures. The conductive structures and the wiring structures may be protected from their surroundings by a passivation layer.

The conductive structure may include a unit structure of a dynamic random access memory (DRAM) device having a transistor and a capacitor corresponding to each other. Otherwise, the conductive structure may include a unit transistor of an operation block of a flash memory device having string transistors, cell transistors and ground transistors. In addition, the conductive structure may include at least one logic device for operating the DRAM device and the flash memory device.

The wiring structure may include a metal plug penetrating through the insulation interlayer and making contact with the conductive structure and a metal wiring extending on the insulation interlayer and connected to the metal plug. The metal wiring may include a signal line for transferring input/output signals to the conductive structure, a power line for applying an electric power to the conductive structure and a ground line for electrically grounding the conductive structure.

The semiconductor chip 20 may include a flip chip structure in which an active face of the semiconductor chip 20 may face down toward an upper surface of the package board 10 and, thus, interconnectors 21 such as solder bumps may be interposed between electrode pads (not shown) of the semiconductor chip 20 and the contact pads of the package board 10. Thus, the semiconductor chip 20 may be electrically connected to the circuit board 10 via the interconnectors 21. The interconnectors 21 may be bonded to the circuit board 10 by a heat treatment such as a reflow process and the gap space between the semiconductor chip 20 and the upper surface of the package board 10 may be filled up with an under-filling layer (not shown). Thus, the semiconductor chip 20 may be electrically and mechanically bonded to the circuit board 10 with high reliability due to the interconnectors 21 and the under-filling layer.

Although not illustrated in the figures, the semiconductor chip 20 may also be mounted on the circuit board 10 in such a configuration that the active face may face upward and thus the semiconductor chip 20 may be bonded to the package board 10 by a bonding wire.

The semiconductor chip 20 may include a single chip structure or a multichip structure such as a chip stack package in which a plurality of the chips may be stacked. Particularly, the chips of the multichip structure may be electrically connected with each other by various connecting member such as, for example, penetration electrodes and bonding wires.

The single chip structure may include a memory device, for example, a dynamic random access memory (DRAM) device and a flash memory device and a logic device for driving the memory device. The single chip structure may include a chip scaled package (CSP) having a single semiconductor chip such as a wafer level chip scaled package (WLCSP) in which a plurality of semiconductor chips and solder bumps may be bonded on a single wafer and the assembly of the chips and the solder bumps may be separated into pieces by a unit of the chip. The flip chip structure of the semiconductor chip 20 may be introduced as the single chip structure in the present example embodiments.

The multichip structure may include a single package structure in which a plurality of memory chips or at least one memory chip and at least one logic chip may be stacked on a single circuit board. For example, the logic chip may include a wafer-level chip and the memory chip may include a sawed chip, and, thus, a plurality of the sawed chips may be stacked on the wafer-level logic chip, thereby manufacturing the multichip structure. Otherwise, the memory chip and the logic chip may be arranged on an upper surface and a lower surface of an interposer, respectively, thereby manufacturing a system in package (SIP) structure.

The non-contact temperature detector 30 may be positioned inside of the semiconductor package 100 and may detect a temperature of an external heat source (not shown) that is spaced apart from the non-contact temperature detector 30. Thus, the temperature of the external heat source may be detected by the non-contact temperature detector 30, even though the external heat source does not make physical contact with the non-contact temperature detector 30. For example, the non-contact temperature detector 30 may include an infrared temperature sensor which may detect a surface temperature of the external heat source by using an infrared radiation emitted from the external heat source. The external heat source may include, for example, a housing enclosing the semiconductor package 100.

Figure 2:
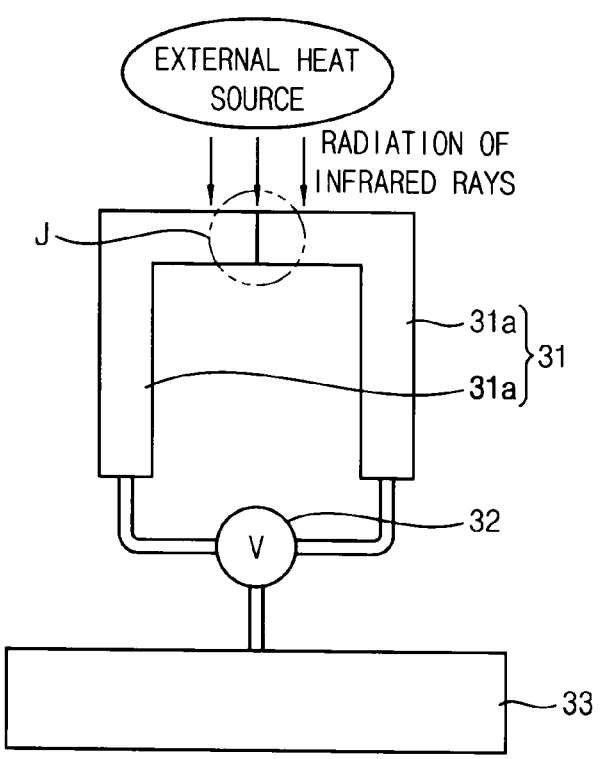
FIG. 2 is a structural view illustrating a non-contact temperature detector of the semiconductor package of FIG. 1 in accordance with an example embodiment of the present inventive concepts.

FIG. 2 is a structural view illustrating the non-contact temperature detector 30 of the semiconductor package illustrated in FIG. 1 in accordance with an example embodiment of the present inventive concepts.

Referring to FIG. 2, the non-contact temperature detector 30 may include an infrared ray (IR) responsive thermocouple 31 generating an electromotive force by absorbing the infrared radiant heat emitted from the external heat source. The non-contact temperature detector 30 may include a voltmeter 32 connected to the thermocouple 31 which measures an electromotive force and a detecting unit 33 which detects a temperature of the external heat source from the measured electromotive force. The voltmeter 32 may be connected to the detecting unit 33. The temperature of the external heat source may be transferred to the temperature controller 40.

The thermocouple 31 may include a pair of first and second metal wirings 31a and 31b having different physical properties. First end portions of the first and the second metal wirings 31a and 31b may be joined together to form a joint portion J and second end portions of the first and the second metal wirings 31a and 31b may be individually connected to the voltmeter 32, respectively. When the external heat source is heated, radiant heat may be generated from the external heat source and the joint portion J of the thermocouple 31 may be heated by the radiant heat generated by the external heat source. The joint portion J of the thermocouple 31 may be positioned at a site where the infrared radiant heat from the external heat source may sufficiently reach the joint portion J of the thermocouple 31. When the joint portion of the thermocouple 31 is heated by the infrared radiant heat from the external heat source, an electromotive force may be generated at the joint portion J by the Seebeck effect. The electrical current caused by the electromotive force generated at the joint portion J may pass through the first and the second metal wirings 31a and 31b. The electrical potential generated by the electrical current may be detected by the voltmeter 32 that is connected to the second ends of the first and the second metal wirings 31a and 31b as the electromotive force.

For example, the first and the second metal wirings 31a and 31b may comprise any one material selected from the group consisting of platinum (Pt), iron (Fe), copper (Cu), and constantan. In the present example embodiments, the pair of the first and the second metal wirings 31a and 31b may include one of a platinum (Pt)-platinum (Pt) pair, an iron (Fe)-constantan pair and a constantan-copper (Cu) pair.

The voltmeter 32 may include an electrical resisting member and an amplifier arranged between the first and the second metal wirings 31a and 31b. The measured electromotive force may be transferred from the voltmeter 32 to the detecting unit 33 and the temperature of the external heat source may be detected from the electromotive force by the detecting unit 33. The temperature of the external heat source may be transferred to the temperature controller 40.

Accordingly, the non-contact temperature detector 30 may detect the temperature of the external heat source without making contact with the external heat source by using infrared radiant heat.

The non-contact temperature detector 30 may be positioned on a surface of the semiconductor chip 20. For example, the non-contact temperature detector 30 may be formed on a wafer having a plurality of chips through a fabrication process as a temperature pattern. However, the non-contact temperature detector 30 may be provided as an additional temperature chip. In such a case, the temperature chip for detecting the temperature of the external heat source and the semiconductor chip 20 may be individually mounted on the package board 10 or the temperature chip may be arranged on an additional structure such as a heat slug, as will be described in detail hereinafter.

While the non-contact temperature detector 30 in the above example embodiment is described as the IR temperature detector, other temperature detectors may also be used as the non-contact temperature detector 30, as long as the temperature of the external heat source may be detected without making contact with the external heat source.

The semiconductor package 100 may include a chip temperature detector 39. The chip temperature detector 39 may detect the temperature of the semiconductor chip 20. Since the temperature of the semiconductor package 100 is mainly determined by the operation heat generated from the semiconductor chip 20, the temperature of the semiconductor chip 20 needs to be accurately detected. For that reason, the chip temperature detector 39 may detect the temperature of the semiconductor chip 20 by making direct contact with the semiconductor chip 20. For example, the chip temperature detector 39 may include a thermo-element such as, for example, a thermistor and a temperature detection pattern that may be arranged on a surface of the semiconductor chip 20. Like the no-contact temperature detector 30, the chip temperature detector 39 may also be provided as an additional temperature chip. In such an embodiment, the temperature chip for detecting the temperature of the chip 20 and the semiconductor chip 20 may be individually mounted on the package board 10 or the temperature chip may be arranged on an additional structure such as a heat slug.

A first detected temperature detected by the non-contact temperature detector 30 and a second detected temperature detected by the chip temperature detector 39 may be transferred to the temperature controller 40. In the temperature controller 40, the first temperature may be compared with a first reference temperature of the external heat source and the second temperature may be compared with a second reference temperature of the semiconductor chip 20. If the first temperature is higher than the first reference temperature or the second temperature is higher than the second reference temperature, the temperature controller 40 may control the operation of the semiconductor chip 20 to thereby reduce the operation heat generated from the semiconductor chip 20. That is, since an overall temperature of the semiconductor package 100 may be mainly determined by the operation heat of the semiconductor chip 20, the temperature controller 40 may, for example, reduce the clock speed of the semiconductor chip 20 or may stop the operation of the semiconductor chip 20, so as to reduce the operation heat of the semiconductor chip 20. Accordingly, operational errors and data loss caused by high heat may be prevented in the semiconductor package 100.

For example, the temperature controller 40 may include a dynamic temperature management DTM tool having a setting unit (not shown) for setting the reference temperatures of the semiconductor package 100 and a controlling unit (not shown) for controlling the operation of the semiconductor chip or a driving circuit when the detected temperatures may be higher than the reference temperatures, respectively. The reference temperatures may include allowable maximal temperatures of the semiconductor package 100. In the present example embodiment, the reference temperatures may include first and second reference temperatures corresponding to the allowable maximal temperatures of the external heat source and the semiconductor chip 20, respectively. The detected temperature may include a first detected temperature by the non-contact temperature detector 30 and a second detected temperature detected by the chip temperature detector 39, respectively.

A driving unit (not shown) may be provided with the temperature controller 40 to apply a driving power to the non-contact temperature detector 30 and/or the chip temperature detector 39. However, the non-contact temperature detector 30 and the chip temperature detector 39 may have their own power lines, respectively.

When an active cooling member such as, for example, an air fan and/or a Peltier effect device is provided with the semiconductor package 100, the driving unit may also drive the active cooling member. Therefore, the semiconductor package 100 may be further cooled down by the active cooling member if the temperatures of the external heat source and the semiconductor chip 20 are too high.

In the present example embodiment, the temperature controller 40 may be positioned inside of the semiconductor chip 20 and the temperature controller 40 may be integrally formed together with the semiconductor chip 20 in one body. In some embodiments, the temperature controller 40 may be manufactured into a control chip which is separated from the semiconductor chip 20. Thus, the control chip of the temperature controller 40 and the semiconductor chip 20 may be mounted on the same package board 10. In another embodiments, the control chip of the temperature controller 40 may be stacked on the semiconductor chip 20. In addition, when the semiconductor package 100 includes a stack structure having a logic device and a memory device, the control chip may be arranged inside the logic device.

An encapsulant 50 may be arranged on the package board 10 to sufficiently cover the semiconductor chip 20. Thus, the semiconductor chip 20 may be sufficiently encapsulated from its external surroundings and may be stably fixed to the package board 10. For example, the encapsulant 50 may include a molding unit (not shown) having an insulating resin arranged on a whole surface of the package board 10 to cover the semiconductor chip 20, and an under-filling layer (not shown) interposed between the package board 10 and the semiconductor chip 20 to thereby secure the semiconductor chip 20 to the package board 10.

The molding unit may include, for example, an epoxy resin, a thermosetting resin and/or a mixture thereof together with silicate, catalyst and various pigments. In the present example embodiment, the molding unit may include, for example, the epoxy resin such as an epoxy molding compound (EMC) and the under-filling layer may include, for example, a mixture of the epoxy resin and a curing agent. A dissipating pillar such as silica may be further included in the under-filing layer.

The semiconductor chip 20 may be covered with the molding unit of the encapsulant 50. In another embodiments, the semiconductor chip 20 may be partially covered with the molding unit in such a way that an upper surface of the semiconductor chip 20 may be coplanar with an upper surface of the encapsulant 50, so that the upper surface of the semiconductor chip 20 may be exposed through the encapsulant 50, as illustrated in FIG. 1. When the semiconductor chip 20 is mounted on the package board 10 in a face-down structure, an upper portion of the encapsulant 50 may be polished until a rear portion of the semiconductor chip 20 is exposed, thereby reducing the thickness of the semiconductor package 100.

When the semiconductor chip 20 is covered with the encapsulant 50, a portion of the encapsulant 50 over the non-contact temperature detector 30 may be removed to thereby form a penetration hole through which the infrared ray emitted from the external heat source may reach the non-contact temperature detector 30 since the infrared ray may be reflected from the encapsulant 50 having a resin mixture. In contrast, when the semiconductor chip 20 is exposed through the encapsulant 50, the infrared ray emitted from the external heat source may sufficiently reach the non-contact temperature detector 30 without any penetration holes since the infrared ray is able to penetrate through silicon. Thus, a penetration hole through the encapsulant 50 may function as a radiant path of the infrared rays emitted from the external heat source.

Therefore, the DTM tool of the semiconductor package 100 may be automatically operated according to the second detected temperature of the semiconductor chip 20 as well as the first detected temperature of the external heat source, thereby increasing the operation efficiency of the semiconductor chip 20.

According to conventional semiconductor packages, the temperature of the external heat source cannot be detected directly from the heat source, and, thus, the temperature of the external heat source is usually determined as an assumptive temperature of the external heat source by adding an experimental safety temperature to the detected temperature of the semiconductor chip. The DTM tool of the conventional semiconductor packages may be operated according to the detected temperature of the semiconductor chip and the assumptive temperature of the external heat source. Thus, when the assumptive temperature of the external heat source is higher than the reference temperature of the external heat source even though the detected temperature of the semiconductor chip is sufficiently lower than the reference temperature of the semiconductor chip, the DTM tool automatically stops the operation of the semiconductor chip, thereby reducing the operation efficiency of the semiconductor packages.

However, according to the example embodiments of the present inventive concepts, the temperature of the external heat source may be directly detected by the non-contact temperature detector 30 and, thus, the DTM tool of the semiconductor package 100 may be operated according to the detected temperature of the external heat source rather than the assumptive temperature of the external heat source. Therefore, an automatic stop of the semiconductor chip operation in an allowable temperature range may be minimized to thereby increase the operation efficiency of the semiconductor package 100.

Various modifications of the semiconductor package 100 may be allowable according to the usage environmental requirements and system requirements of the electronic system including the semiconductor package 100. Thus, arrangements of the non-contact temperature detector 30 may be modified according to the modifications of the semiconductor package 100.

Figure 3:
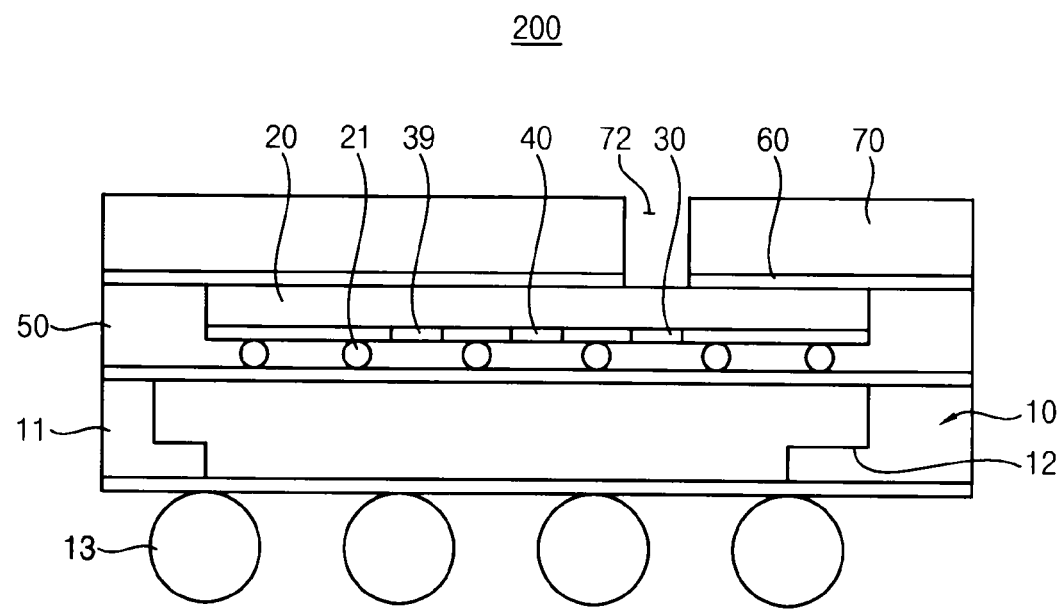
FIG. 3 is a cross-sectional view illustrating a another semiconductor package in accordance with an example embodiment of the present inventive concepts.

FIG. 3 is a cross-sectional view illustrating a semiconductor package 200 in accordance with an example embodiment of the present inventive concepts. The semiconductor package 200 includes modifications to the semiconductor package 100 illustrated in FIG. 1. The semiconductor package 200 may have substantially the same structures as the semiconductor package 100 illustrated in FIG. 1, except the semiconductor package 200 includes a heat slug 70 for dissipating the operation heat of the semiconductor chip 20. Thus, the same reference numerals in FIG. 3 that are in FIG. 1 denote the same elements of the semiconductor package 100 in FIG. 1, and any further detailed descriptions on the same elements will be omitted.

Referring to FIG. 3, the semiconductor package 200 may include the heat slug 70 positioned on the encapsulant 50, and, thus, the operation heat of the semiconductor chip 20 may be dissipated through the heat slug 70. For example, the heat slug 70 may be adhered to the encapsulant 50 by an adhesive 60 having good heat conductivity.

In the present example embodiment of FIG. 3, the upper surface of the semiconductor chip 20 may be coplanar with the upper surface of the encapsulant 50 and, thus, the semiconductor chip 20 may be exposed through the encapsulant 50. Thus, the heat slug 70 may have an exposed molded under-fill (eMUF) structure. However, the semiconductor chip 20 may also be covered with the encapsulant 50, as described above in connection with FIG. 1.

The adhesive 60 may include an epoxy resin and an insulating material such as, for example, polyimide and/or permanent photoresist. A dissipating supplemental may be further arranged in the adhesive 60 for accelerating the heat dissipation toward the heat slug 70. For example, the dissipating supplemental may include thermal interface materials (TIM), a metal paste and/or nano-sized particles.

In such an embodiment, portions of the adhesive 60 and the heat slug 70 over the non-contact temperature detector 30 may be removed to thereby form a penetration hole 72 through which the portion of the semiconductor chip 20 having the non-contact temperature detector 30 may be exposed. Thus, the penetration hole 72 may function as a radiant path of the infrared rays emitted from the external heat source, and, thus, the infrared radiant heat may reach the non-contact temperature detector 30 through the penetration hole 72.

Therefore, the temperature of the external heat source may be directly detected using the infrared radiant heat transferred to the non-contact temperature detector 30 through the penetration hole 72. In embodiments in which the infrared radiant heat emitted from the external heat source may be reflected from the heat slug 70 and the adhesive 60 before reaching the non-contact temperature detector 30 when there is no penetration hole 72, the heat slug 70 and the adhesive 60 may be partially removed and the penetration hole 72 may be provided as the radiant path. When the heat slug 70 and the adhesive 60 comprise materials through which the infrared radiant heat may transmit or the external heat source may emit a radiant heat that can penetrate through the heat slug 70 and the adhesive 60, the penetration hole 72 may not be necessary in the semiconductor package 200.

Figure 4:
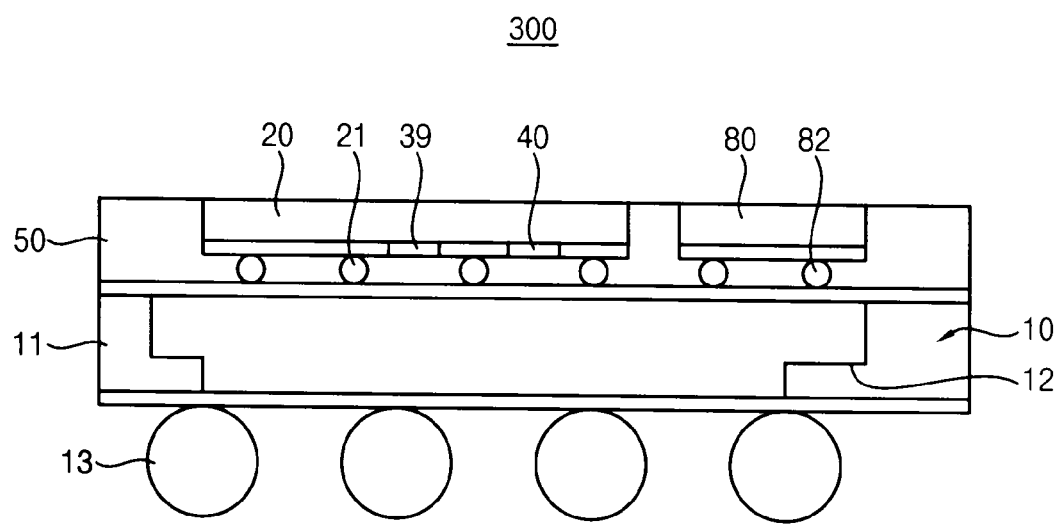
FIG. 4 is a cross-sectional view illustrating another semiconductor package in accordance with an example embodiment of the present inventive concepts.

FIG. 4 is a cross-sectional view illustrating a semiconductor package 300 in accordance with an example embodiment of the present inventive concepts. The semiconductor package 300 includes modifications to the semiconductor package 100 illustrated in FIG. 1. The semiconductor package 300 may have substantially the same structures as the semiconductor package illustrated in FIG. 1, except that the semiconductor package 300 includes a non-contact temperature detector 80 mounted on the package board as an additional chip. Thus, the same reference numerals in FIG. 4 that are in FIG. 1 denote the same elements of the semiconductor chip 100 in FIG. 1, and any further detailed descriptions on the same elements will be omitted.

Referring to FIG. 4, the semiconductor package 300 may include the non-contact temperature detection chip 80 that may detect the temperature of the external heat source without making contact with the external heat source.

The non-contact temperature detector 30 in FIG. 1 may be formed on a wafer by semiconductor fabrication processes and the wafer may be cut into pieces to form temperature detection chip 80 that may detect the temperature of the external heat source without making direct contact with the heat source. Thus, the semiconductor chip 20 and the temperature detection chip 80 may be individually fabricated in respective processes, and may be individually mounted onto the package board 10, respectively.

In the present example embodiment of FIG. 4, the temperature detection chip 80 may be mounted on the package board 10 in a flip chip structure. In such a case, the temperature detection chip 80 may be electrically and mechanically connected to the package board 10 by solder bumps. However, the temperature detection chip 80 may be mounted on the package board 10 in a face-up structure. In such a case, the temperature detection chip 80 may be electrically connected to the package board 10 by a bonding wire.

The temperature detection chip 80 may be electrically connected to the temperature controller 40, which may be arranged inside the semiconductor chip 20, via the electrical circuit pattern 12 of the package board 10. Therefore, the temperature of the external heat source, which may be detected by the temperature detection chip 80, may be transferred to the temperature controller 40, and the operation of the semiconductor chip 20 may be controlled by the temperature controller 40 according to the temperature of the external heat source and the temperature of the semiconductor chip 20.

Figure 5:
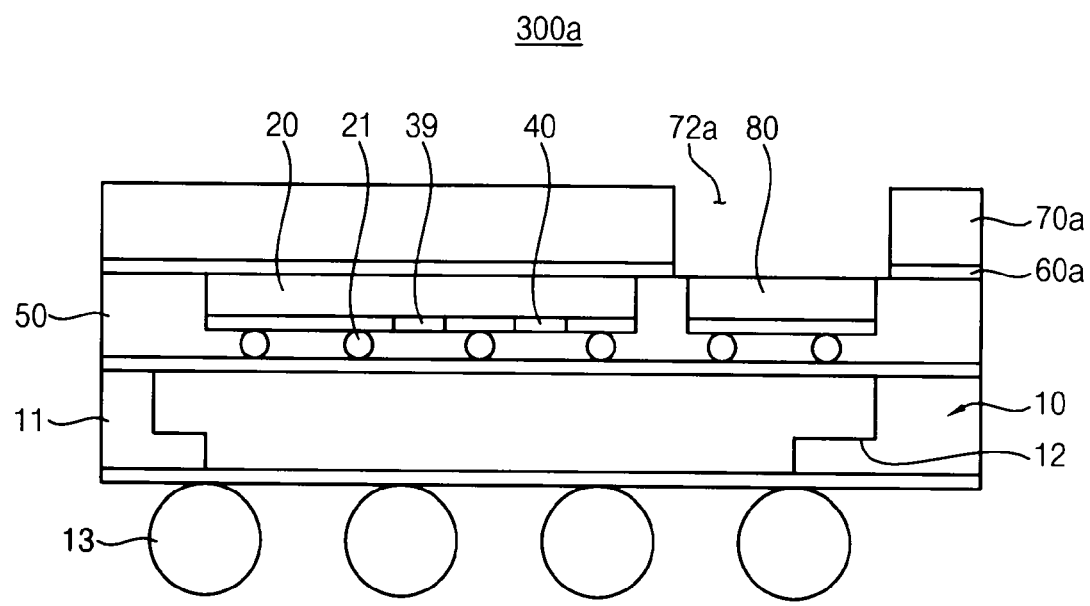
FIG. 5 is a cross-sectional view illustrating another semiconductor package in accordance with an example embodiment of the present inventive concepts.

FIG. 5 is a cross-sectional view illustrating a semiconductor package 300a in accordance with an example embodiment of the present inventive concepts. The semiconductor package 300a includes modifications to the semiconductor package 600 illustrated in FIG. 4.

Referring to FIG. 5, the semiconductor package 300a may have substantially the same structures as the semiconductor package 300 illustrated in FIG. 4, except that the semiconductor package 300a includes the same heat slug 70 and the adhesive 60 as described with reference to FIG. 3 arranged on the semiconductor package 300 described with reference to FIG. 4. Thus, portions of adhesive 60a and heat slug 70a over the temperature detection chip 80 may be removed to thereby provide the penetration hole 72a through which the infrared radiant heat from the external heat source may reach the temperature detection chip 80. Thus, the temperature detection chip 80 may detect the temperature of the external heat source by using the infrared radiant heat without making contact with the heat source. When the heat slug 70a and the adhesive 60a comprise materials through which the infrared radiant heat may transmit or the external heat source may emit a radiant heat that can penetrate through the heat slug 70a and the adhesive 60a, the penetration hole 72a may not be necessary in the semiconductor package 300a.

Figure 6:
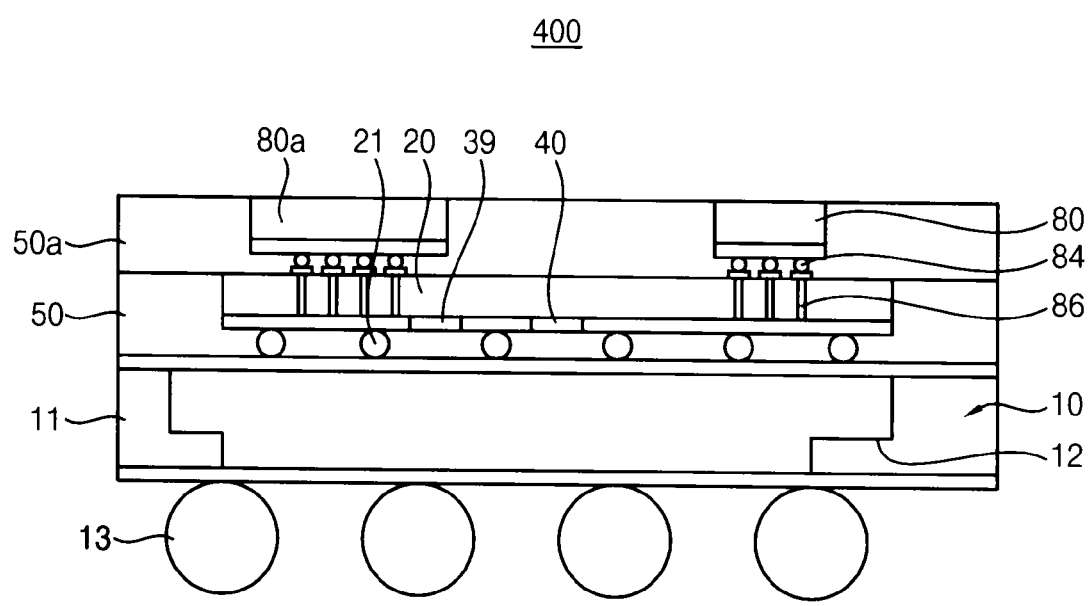
FIG. 6 is a cross-sectional view illustrating another semiconductor package in accordance with an example embodiment of the present inventive concepts.

FIG. 6 is a cross-sectional view illustrating a semiconductor package 400 in accordance with an example embodiment of the present inventive concepts. The semiconductor package 400 includes modifications to the semiconductor package 100 illustrated in FIG. 1. The semiconductor package 400 may have substantially the same structures as the semiconductor package 100 illustrated in FIG. 1, except that semiconductor package 400 includes the temperature detection chip 80 and an additional semiconductor chip 80a mounted on the package board 10 as additional chips. Thus, the same reference numerals in FIG. 6 as in FIG. 1 denote the same elements of the semiconductor chip 100 in FIG. 1, and any further detailed descriptions on the same elements will be omitted.

Referring to FIG. 6, the semiconductor package 400 may include the temperature detection chip 80 and the additional semiconductor chip 80a that may be arranged on the semiconductor chip 20.

For example, the temperature detection chip 80 and the additional semiconductor chip 80a may be stacked on the semiconductor chip 20 to thereby be configured to have a chip stack package. The temperature detection chip 80 and the additional semiconductor chip 80a may be electrically connected to the semiconductor chip 20 by penetration electrodes 86. For example, the semiconductor chip 20 may include a logic device and the additional semiconductor chip 80a may include a memory device. The penetration electrode 86 may include a through-silicon via TSV electrode and a plurality of contact bumps 84 may be interposed between the additional semiconductor chip 80a and the semiconductor chip 20 and between the temperature detection chip 80 and the semiconductor chip 20.

The temperature controller 40 is arranged in the semiconductor chip 20. However, the temperature controller 40 may be arranged in the additional semiconductor chip 80a rather than in the semiconductor chip 20 and an additional chip temperature detector (not shown) may be further arranged in the additional semiconductor chip 80a.

An additional encapsulant 50a may be provided on the encapsulant 50 in such a way that the temperature detection chip 80 and the additional semiconductor chip 80a may be protected from their surroundings and may be stably secured to the encapsulant 50 and the semiconductor chip 20.

The temperature of the external heat source, which may be detected by the temperature detection chip 80, may be transferred to the temperature controller 40 via the contact bumps 84 and the penetration electrodes 86. When at least one of the temperatures of the external heat source and the semiconductor chip 20 is higher than the respective reference temperatures, the operation of the semiconductor chip 20 may be controlled by the temperature controller 40, to thereby reduce the operation heat of the semiconductor chip 20. In an embodiment in which the temperature of the additional semiconductor chip 80a may be further transferred to the temperature controller 40, the operation of the additional semiconductor chip 80a may also be controlled by the temperature controller 40.

Figure 7:
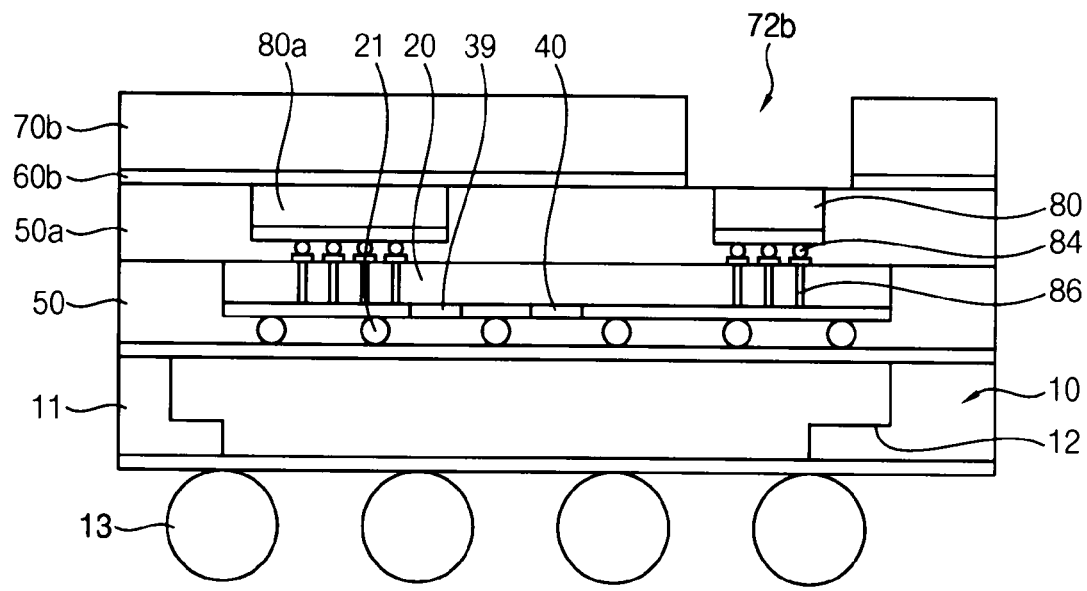
FIG. 7 is a cross-sectional view illustrating another package in accordance with an example embodiment of the present inventive concepts.

FIG. 7 is a cross-sectional view illustrating a semiconductor package 400a in accordance with an example embodiment of the present inventive concepts. The semiconductor package 400a includes modifications to the semiconductor package 400 illustrated in FIG. 6.

Referring to FIG. 7, the semiconductor package 400a may have substantially the same structures as the semiconductor package 400 illustrated in FIG. 6, except that the semiconductor package 400a includes the same heat slug 70 and the adhesive 60 as described with reference to FIG. 3 arranged on the semiconductor package 400 of FIG. 6. Thus, adhesive 60b and the heat slug 70b over the temperature detection chip 80 may be removed to thereby provide the penetration hole 72b through which the infrared radiant heat from the external heat source may reach the temperature detection chip 80. Thus, the temperature detection chip 80 may detect the temperature of the external heat source by using the infrared radiant heat without making contact with the external heat source. When the heat slug 70b and the adhesive 60b comprise materials through which the infrared radiant heat may transmit or the external heat source may emit a radiant heat that can penetrate through the heat slug 70b and the adhesive 60b, the penetration hole 72b may not be necessary in the semiconductor package 400a.

Figure 8:
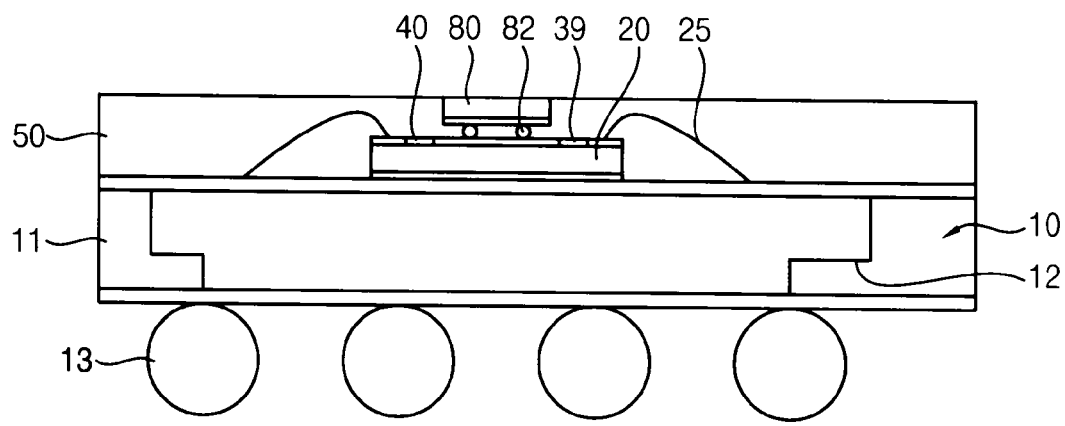
FIG. 8 is a cross-sectional view illustrating another semiconductor package in accordance with an example embodiment of the present inventive concepts.

FIG. 8 is a cross-sectional view illustrating a semiconductor package 500 in accordance with an example embodiment of the present inventive concepts. The semiconductor package 500 includes modifications to the semiconductor package 400 illustrated in FIG. 6.

Referring to FIG. 8, the semiconductor package 500 may have substantially the same structures as the semiconductor package 400 illustrated in FIG. 6, except that the semiconductor package 500 includes the semiconductor chip 20 connected to the package board 10 by bonding wires 25 and no additional semiconductor chips are mounted on the package board 10. The additional semiconductor package 80a may be further provided with the semiconductor package 500, as would be known to one of the ordinary skill in the art. That is, the semiconductor package 80a may be provided adjacent to the temperature detection chip 80 on the semiconductor chip 20.

Thus, the semiconductor chip 20 may be connected to the package board 10 by the bonding wires 25 and the temperature detection chip 80 may be connected to the semiconductor chip 20 through a plurality of solder bumps 82.

The temperature of the external heat source, which may be detected by the temperature detection chip 80 without making direct contact with the external heat source, may be transferred to the temperature controller 40 via the solder bumps 82. Thus, the operation of the semiconductor chip 20 may be controlled by the temperature controller 40 based on the detected temperature of the external heat source in place of the assumptive temperature of the external heat source and based on the detected temperature of the semiconductor chip 20.

Figure 9:
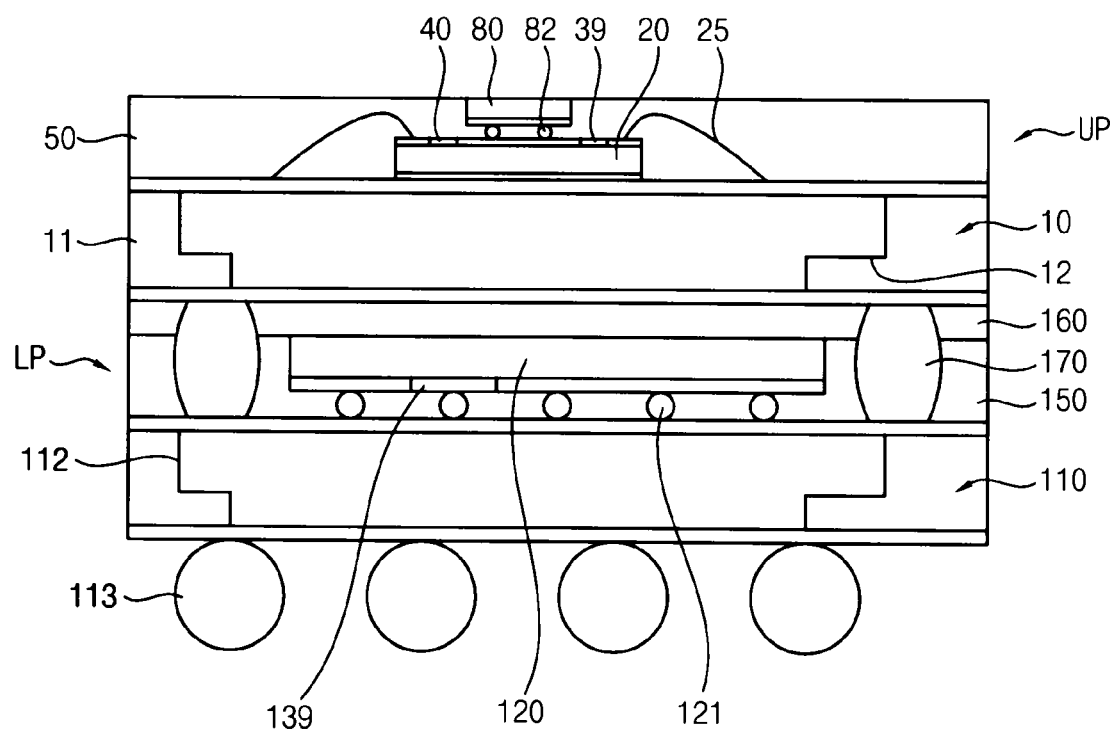
FIG. 9 is a cross-sectional view illustrating another semiconductor package in accordance with an example embodiment of the present inventive concepts.

FIG. 9 is a cross-sectional view illustrating a semiconductor package 600 in accordance with an example embodiment of the present inventive concepts. The semiconductor package 600 includes modifications to the semiconductor package 500 illustrated in FIG. 8.

Referring to FIG. 9, the semiconductor package 600 may include the semiconductor package 500 illustrated in FIG. 8 that may be stacked on a semiconductor package. Thus, the semiconductor package 600 may include a lower package LP and an upper package UP that may be stacked on the lower package LP, thereby providing a package-on-package (PoP) structure.

For example, the upper package UP may include the semiconductor package 500 illustrated in FIG. 8. However, any other semiconductor packages may be used as the upper package UP as long as the non-contact temperature detector, for example non-contact temperature detector 30, or the temperature detection chip, for example temperature detection chip 80, may be arranged in the semiconductor package. Thus, the semiconductor packages described in detail with reference to FIGS. 1 and 3 to 11 may also be used as the upper package UP.

The lower package LP may include a lower package board 110, a lower semiconductor chip 120 mounted on the lower package board 110 and a lower encapsulant 150 that may secure the lower semiconductor chip 120 to the lower package board 110. The lower package LP may include various package structures according to usage requirements. For example, the lower package LP may include a system in package (SIP) structure in which a plurality of chip structures may be mounted on the lower package board 110. In some embodiments, a chip stack package may be arranged as the semiconductor chip 120 of the lower package LP. In another embodiment, a single chip such as a wafer level chip scale package may be arranged as the semiconductor chip 120 of the lower package LP.

The lower package LP and the upper package UP may be connected to each other by a conductive contact plug 170. The contact plug 170 may penetrate through the lower encapsulant 150 and may make contact with a lower contact pad (not shown) of the lower package LP and simultaneously with an upper contact pad (not shown) of the upper package UP. The contact plug 170 may comprise a metal having sufficient electrical conductivity and mechanical rigidity and, thus, the lower package board 110 may be coupled to the upper package board 10 with high electrical conductivity and mechanical stability.

An under-fill resin 160 having good thermal conductivity may be interposed between the upper package UP and the lower package LP, thereby improving the mechanical stability of the upper package UP and the lower package LP with excellent dissipation characteristics.

The temperature controller 40 and the chip temperature detector 39 may be arranged in the semiconductor chip 20 and a lower chip temperature detector 139 for detecting the temperature of the lower semiconductor chip 120 may be arranged in the lower semiconductor chip 120. Thus, the temperature of the lower semiconductor chip 120, the temperature of the semiconductor chip 20 and the temperature of the external heat source, which may be detected by the temperature detection chip 80 without making contact with the external heat source. The temperature of the external heat source, which may be detected by the temperature detection chip 80 without making direct contact with the external heat source, may be transferred to the temperature controller 40 via the solder bumps 82. The temperature of the lower semiconductor chip 120 may be transferred to the temperature controller 40 via the contact plug 170, the circuit pattern 120 of the lower package board 110 and the circuit pattern 12 of the upper package board 10.

The temperature controller 40 may include reference temperatures of the external heat source, the lower package LP and the upper package UP, respectively. Thus, the detected temperatures of the external heat source, the lower semiconductor chip 120 and the upper semiconductor chip 20 may be compared with the respective reference temperatures. When any one of the detected temperatures is higher than the respective reference temperatures, at least one of the lower semiconductor chip 120 and the upper semiconductor chip 20 may be controlled by the temperature controller 40, to thereby reduce the operation speeds of at least one of the semiconductor chips 120 and 20 or stop at least one of the semiconductor chips 120 and 20. Accordingly, the semiconductor package 600 may be maintained under the reference temperature, thereby minimizing the operation failures and improving data reliability of the semiconductor package 600.

Figure 10:
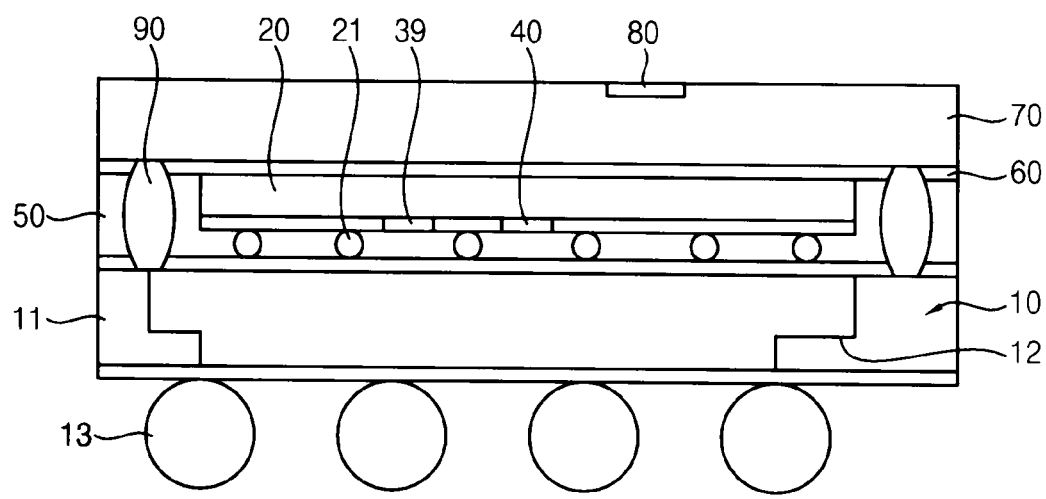
FIG. 10 is a cross-sectional view illustrating another semiconductor package in accordance with an example embodiment of the present inventive concepts.

FIG. 10 is a cross-sectional view illustrating an semiconductor package 700 in accordance with an example embodiment of the present inventive concepts. The semiconductor package 700 includes modifications to the semiconductor package 300a illustrated in FIG. 5. The semiconductor package 700 may have substantially the same structures as the semiconductor package 300a described in detail with reference to FIG. 5, except that the semiconductor package 700 includes the temperature detection chip 80 arranged on the heat slug 70. Thus, the same reference numerals in FIG. 10 as in FIG. 5 denote the same elements of the semiconductor package 300a in FIG. 5, and any further detailed descriptions on the same elements will be omitted.

Referring to FIG. 10, the semiconductor package 700 may include the temperature detection chip 80 arranged on the heat slug 70 and a conductive contact plug 90 for electrically connecting the heat slug 70 and the package board 10. Since the temperature detection chip 80 is arranged on a surface of the heat slug 70, no penetration hole for the radiant path is required. That is, the infrared radiant heat may directly reach the temperature detection chip 80 without the radiant path, thereby accurately detecting the temperature of the external heat source by using the infrared radiant heat without having contact with the external heat source.

For example, the heat slug 70 may include a metal body having good thermal conductivity, a dielectric layer (not shown) on the body and a conductive pattern positioned on the dielectric layer and connected to the contact plug 90. The temperature detection chip 80 may be arranged on the dielectric layer and may be electrically connected to the conductive pattern and the conductive pattern may be connected to the contact plug 90. Thus, the temperature detection chip 80 may be connected to the circuit pattern 12 of the package board 10 via the conductive pattern and the contact plug 90.

Thus, the temperature of the external heat source, which may be detected by the temperature detection chip 80 without making contact with the external heat source, may be transferred to the temperature controller 40, which may be arranged inside of the semiconductor chip 20, via the conductive pattern, the contact plug 90 and the circuit pattern 12. Therefore, the operation of the semiconductor chip 20 may be controlled by the temperature controller 40 based on the detected temperature of the external heat source rather than the assumptive temperature of the external heat source and the detected temperature of the semiconductor chip 20, thereby controlling the temperature of the semiconductor package 700.

Although not shown in figures, the temperature controller 40 may also be arranged on the dielectric layer of the heat slug 70 rather than inside of the semiconductor chip 20, similar to the temperature detection chip 80. In such an embodiment, the control signal for the operation of the semiconductor chip 20 may be applied through the conductive pattern, the contact plug 90 and the circuit pattern 12 of the package board 10.

Figure 11:
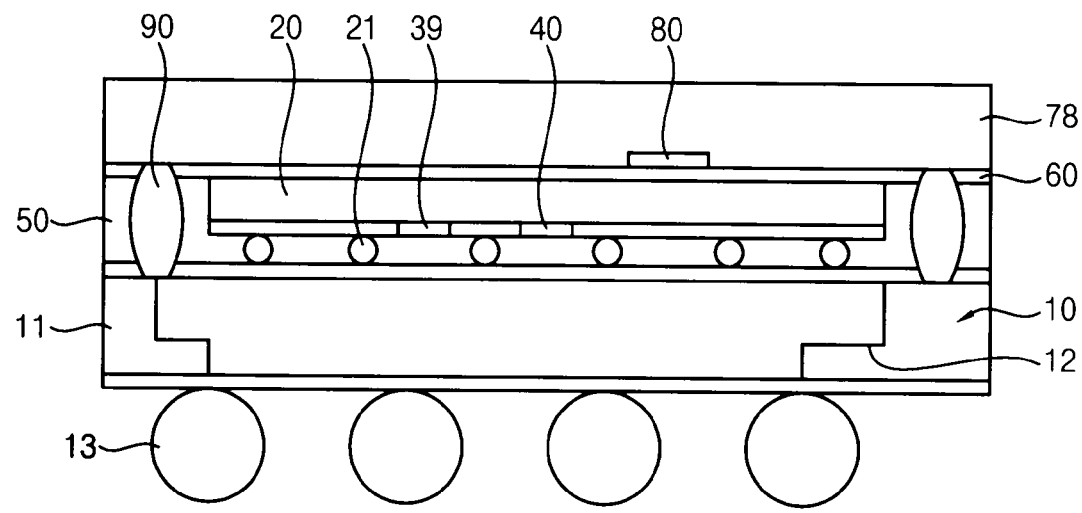
FIG. 11 is a cross-sectional view illustrating another semiconductor package in accordance with an example embodiment of the present inventive concepts.

FIG. 11 is a cross-sectional view illustrating a semiconductor package 800 in accordance with an example embodiment of the present inventive concepts. The semiconductor package 800 includes modifications to the semiconductor package 700 illustrated in FIG. 10. The semiconductor package 800 may have substantially the same structures as the semiconductor package 700 described in detail with reference to FIG. 10, except that the semiconductor package 800 includes a conductive interconnection substrate 78 may be provided rather than the heat slug. Thus, the same reference numerals in FIG. 11 as in FIG. 10 denote the same elements of the semiconductor package 700 in FIG. 10, and any further detailed descriptions on the same elements will be omitted.

Referring to FIG. 11, the semiconductor package 800 may include the conductive interconnection substrate 78 on the semiconductor chip 20 and the encapsulant 50. In the present example embodiment of FIG. 11, the interconnection substrate 78 may include an interposer having an electrical circuit therein and may be adhered to the semiconductor chip 20 and the encapsulant 50 by the adhesive 60.

Therefore, the semiconductor chip 20 may be positioned under the interposer. An additional conductive structure (not shown), an additional chip structure (not shown) and an additional package structure (not shown) may be positioned on the interposer. Accordingly, a larger number of the chip structures and package structures may be arranged in the semiconductor package 800, thereby increasing the degree of the integration of the semiconductor package 800.

In the present example embodiment, the interconnection substrate 78 may include a silicon interposer and the temperature detection chip 80 may be positioned at a lower surface of the silicon interposer. When the interconnection substrate 78 includes a plastic interposer, the temperature detection chip 80 may be positioned at an upper surface of the plastic interposer or be positioned at the lower surface of the plastic interposer in an embodiment in which the plastic interposer includes a radiant path through which the infrared radiant heat from the external heat source may reach the temperature detection chip 80. The infrared radiant heat may penetrate through the silicon interposer while being reflected from the plastic interposer.

The various semiconductor packages shown in FIGS. 3 to 11 are illustrative of example embodiments in which the arrangements of the non-contact temperature detector may be modified in positions and configurations, and, thus, the foregoing semiconductor packages are not to be construed as limiting thereof.

Electronic System Including the Semiconductor Package

Figure 12:
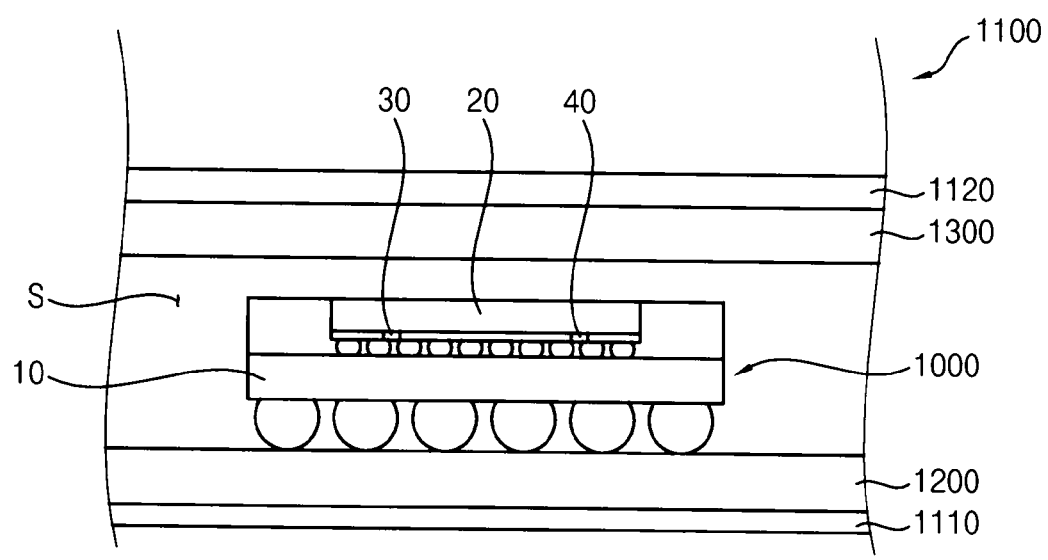
FIG. 12 is a structural view illustrating an electronic system including a semiconductor package having a non-contact temperature detector in accordance with an example embodiment of the present inventive concepts.

FIG. 12 is a structural view illustrating an electronic system including the semiconductor packages having a non-contact temperature detector, as described above in connection with FIGS. 1-11, in accordance with an example embodiment of the present inventive concepts.

Referring to FIG. 12, the electronic system 2000 in accordance with an example embodiment of the present inventive concepts may include a housing 1100 having a receiving space S in which a mother board 1200 may be received and a semiconductor package 1000 combined with the mother board 1200. For example, the semiconductor package 1000 may include a package board 10 having an electric circuit pattern 12 therein, as illustrated in FIGS. 1 and 3-11, and combined with the mother board 1200, a semiconductor chip 20 mounted on the package board 10 and electrically connected with the electric pattern 12 of the package board 10, a non-contact temperature detector 30 detecting a temperature of the housing 1100 that is spaced apart from the temperature detector 30 such that the non-contact temperature detector 30 does not make contact with the housing 1100, and a temperature controller 40 controlling the semiconductor chip 20 according to the temperature of the housing 1100 that is detected by the non-contact temperature detector 30.

For example, the housing 1100 may maintain an external shape of the electronic system 2000 and may protect the inner parts such as the semiconductor package 1000 of the electronic system 2000 from their surroundings. Particularly, the housing 1100 may have sufficient rigidity and stiffness for protecting the inner parts of the electronic system 2000 and may have sufficient thermal conductivity for efficiently dissipating the heat outwards from the semiconductor package 1000.

In the present example embodiment of FIG. 12, the housing 1100 may include a lower housing 1110 on which the mother board 1200 may be positioned and an upper housing 1120 covering the semiconductor package 1000 secured by a bracket 1300 to thereby separate the semiconductor package 1000 from the surroundings Of the electronic system 2000. Thus, the semiconductor package 1000 may be stably secured to the mother board 1200 in the receiving space S of the housing 1100.

The semiconductor package 1000 may be secured to the mother board 1200 and may perform a function for the electronic system 2000. In the present example embodiment, the semiconductor package 1000 may include the semiconductor chip 20 mounted for conducting an expected function for the electronic system 2000, the non-contact temperature detector 30 for detecting the temperature of the housing 1100 without making contact with the housing 1100 and the temperature controller 40 for controlling the operation of the semiconductor chip 20 according to the detected temperature of the housing 1100 and the detected temperature of the semiconductor chip 20. In the present example embodiment, the semiconductor package 1000 may have substantially the same structures and configurations as described with reference to FIG. 1. However, any one of the semiconductor packages described in detail with reference to FIGS. 3 to 11 may also be used as the semiconductor package 1000 in the present example embodiment. Thus, any further detailed descriptions on the structures of the semiconductor package 1000 will be omitted.

When the temperature of the housing 1100 is excessively high, the operation heat generated from the semiconductor chip 20 may not be efficiently dissipated outwards from the semiconductor chip 20 and, thus, the semiconductor package 1000 may be broken down. In the present example embodiment, the infrared radiant heat emitted from the housing 1100 may be measured by the non-contact temperature detector 30 to thereby detect the temperature of the housing 1100. That is, the temperature of the housing 1100 may be detected by the non-contact temperature detector 30 without the non-contact temperature detector 30 making contact with the housing 1100 and the detected temperature of the housing 1100 may be transferred to the temperature controller 40. The temperature controller 40 may control the operation of the semiconductor chip 20 according to the detected temperature of the housing 1100. That is, when the detected temperature of the housing 1100 is higher than the reference temperature of the housing 1100, the temperature controller 40 may control the semiconductor chip 20 to reduce the operation heat of the semiconductor chip 20 so as to reduce the temperature of the housing 1100. Accordingly, the electronic system 2000 including the semiconductor package 1000 may have improved system reliability. Particularly, the operation control of the semiconductor chip 20 may be determined by the detected temperature of the housing 1100 rather than the assumptive temperature of the housing 1100, thereby improving the operation efficiency of the semiconductor chip 20.

While the non-contact temperature detector 30 may be integrally arranged inside the semiconductor chip 20 in one body, various arrangements and configurations of the non-contact temperature detector 30 may be allowable according to the structures of the semiconductor package 1000. That is, the non-contact temperature detector 30 may be formed into an integrated circuit pattern in the semiconductor chip 20 or into an additional chip structure, for example, temperature detection chip 80, such as the temperature detection chip 80 separated from the semiconductor chip 20. The temperature detection chip 80 may be mounted on the package board 10 or may be stacked on the semiconductor package 20 as described above.

In addition, when a heat slug is provided with the semiconductor package 1000, the temperature detection chip 80 may be arranged on the heat slug. The temperature of the housing 1100, which may be detected by the temperature detection chip 80 on the heat slug without making contact with the housing 1100, may be transferred to the temperature controller 40 via the contact plug (not shown) interposed between the heat slug and the package board 10 as described above.

In the present example embodiment, the semiconductor chip 20 may include a system-in-package (SIP) structure in which the memory device and the logic device may be arranged in a single chip. For example, the semiconductor chip 20 having the SIP structure may include a central process unit (CPU), a graphic process unit (GPU) and a logic device and a memory device connected tot the CPU and the GPU. The temperature of the housing 1100 may be detected by the non-contact temperature detector 30 without the non-contact temperature detector 30 making contact with the housing 1100 and the detected temperature of the housing 1200 may be transferred to the temperature controller 40. The temperatures of the CPU & GPU and the memory device may be detected by the chip temperature detector, for example chip temperature detector 39, respectively. The temperature controller 40 may individually control each operation of the CPU, GPU and the memory device of the SIP structure according to the detected temperatures of the housing 1100, the CPU, the GPU and the memory device. That is, when any one of the detected temperatures of the CPU, the GPU and the memory device of the SIP structure may be higher than the reference temperatures of the CPU, the GPU and the memory device, respectively, the temperature controller 40 may individually control the CPU, the GPU and the memory device to reduce the operation heat so as to reduce each temperature of the CPU, GPU and the memory device of the SIP structure. Accordingly, the temperature of the electronic system 2000 including the semiconductor package 1000 may be accurately controlled according to the detected temperature of the housing 1100 that may be spaced apart from the semiconductor package 1000 as well as according to the detected temperature of the semiconductor chip 20, especially according to each temperature of the components of the semiconductor chip 20 having the SIP structure, thereby increasing the system reliability of the electronic system 2000. The operation control of the semiconductor chip 20 may be determined by the detected temperature of the housing 1100 rather than the assumptive temperature of the housing 1100, thereby improving the operation efficiency of the semiconductor chip 20.

Figure 13:
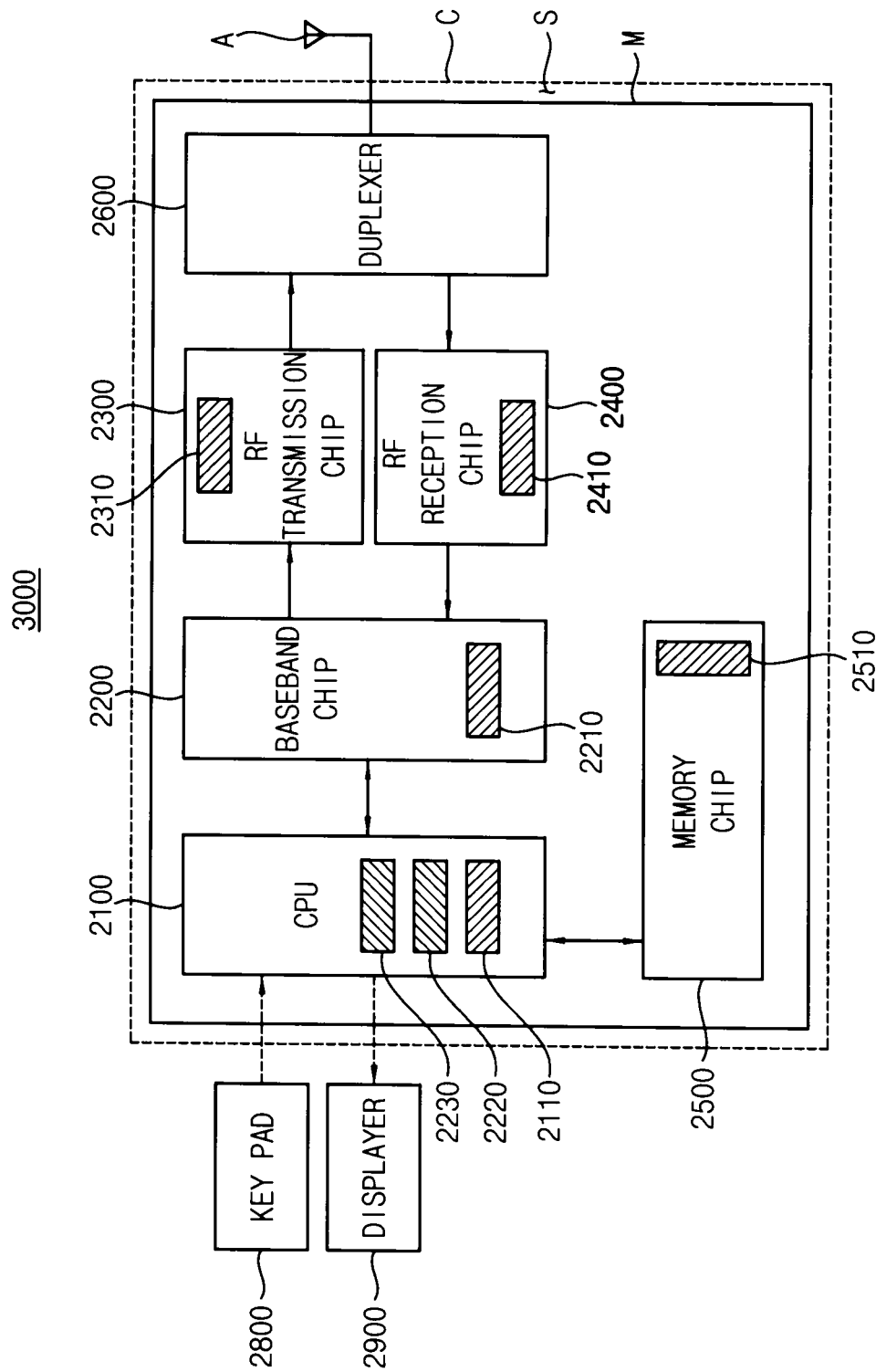
FIG. 13 is a block diagram illustrating a mobile system including a semiconductor package in accordance with an example embodiment of the present inventive concept.
Figure 14:
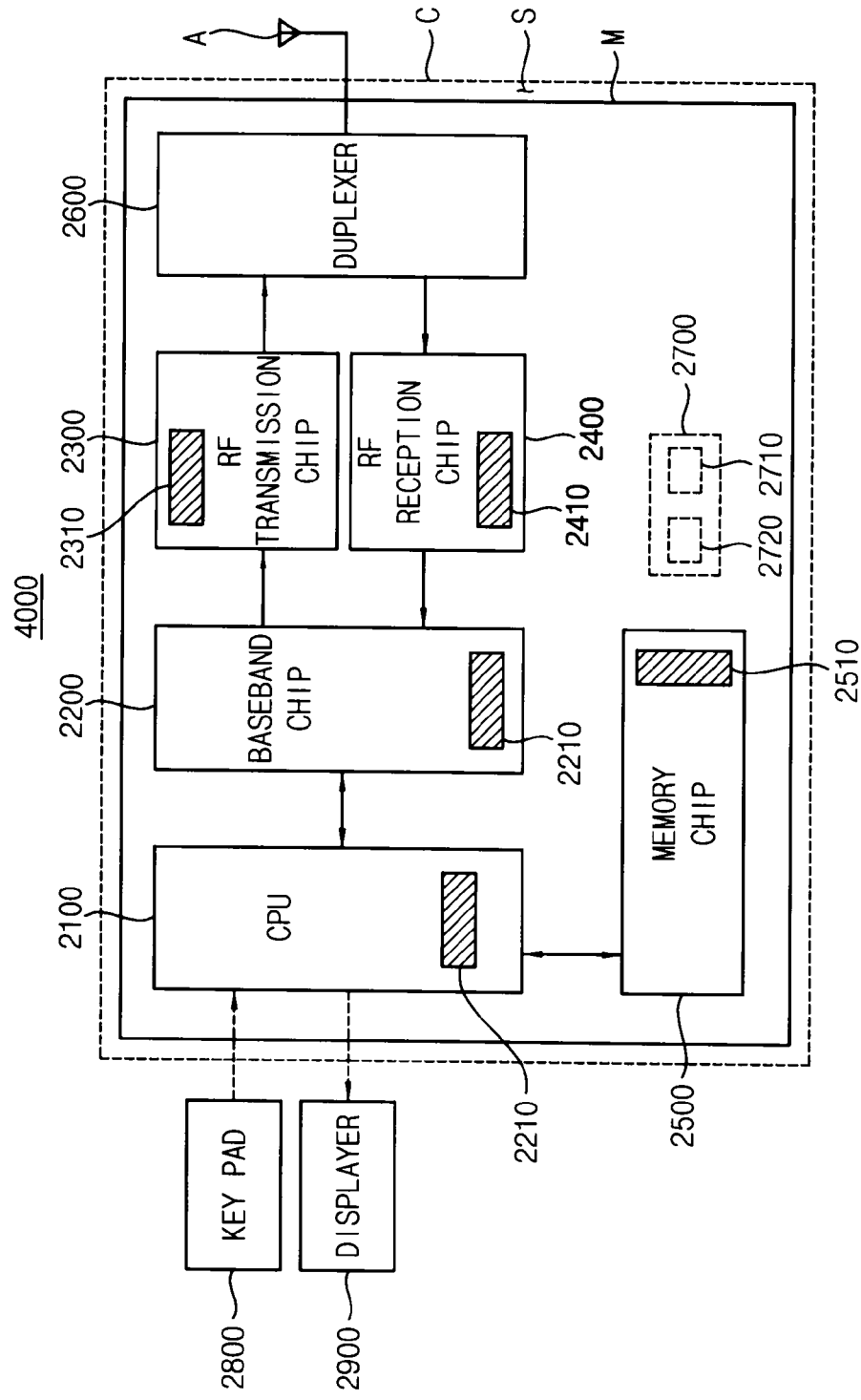
FIG. 14 is a block diagram illustrating another mobile system in accordance with an example embodiment of the present inventive concept.

FIG. 13 is a block diagram illustrating a mobile system 3000 including a semiconductor package in accordance with an example embodiment of the present inventive concepts. FIG. 14 is a block diagram illustrating another mobile system 4000 in accordance with an example embodiment of the present inventive concepts. The mobile system 4000 includes modifications to the mobile system 3000 of FIG. 13.

Referring to FIG. 13, the mobile system 3000 may include a case C having a receiving space S in which a mother board M may be received and a plurality of semiconductor packages may be mounted on the mother board M.

For example, a central process unit (CPU) structure 2100, a baseband chip structure 2200, a radio frequency (RF) transmission chip structure 2300, a RF reception chip structure 2400 and a plurality of memory chip structures 2500 may be mounted on a surface or both surfaces of the mother board M. Each of the chip structures 2100 to 2500 may be provided as a package structure, and, thus, a plurality of the semiconductor packages may be mounted on the mother board M. The CPU structure 2100 mainly performs a function of generating and analyzing signals such as CDMA signals to be transmitted to and/or received from a base station when making a mobile phone call and/or using a wireless internet. In addition, the CPU structure 2100 may process audio and video signals for transmitting multimedia data. Further, the CPU structure 2100 may receive a key input signal from a key pad 2800 and may control a displayer 2900 for visually displaying system states and operation process of the mobile system 3000. The memory chip structure 2500 may include a plurality of memory devices such as NAND flash memory devices and SDRAM devices for storing data that may be needed for controlling the CPU structure 2100. The RF transmittance and reception chip structures 2300 and 2400 may transmit and receive RF signals to/from the base station through an antenna A, respectively. The received RF signals may be separated from one another by a duplexer structure 2600. The baseband chip structure 2200 may process digital signals and calling signals.

In the present example embodiment of FIG. 13, the CPU structure 2100, the baseband chip structure 2200, the RF transmittance and reception chip structures 2300 and 2400 and the memory chip structure 2500 may include any one of the semiconductor packages described in detail with reference to FIGS. 1 and 3-11, and may be mounted on the mother board M.

For example, chip temperature detectors 2110, 2210, 2310, 2410 and 2510 may be arranged on each of semiconductor chips that may be included in each of the chip structures 2100 to 2500, respectively, and a non-contact temperature detector 2220 may be arranged on the CPU structure 2100 and may detect the temperature of the case C without making contact with the case C. In addition, a temperature controller 2230 may also be arranged on the CPU structure 2100. The detected temperatures of each semiconductor chip in the chip structures 2100 to 2500 and the detected temperature of the case C may be transferred to the temperature controller 2230.

Since the baseband chip structure 2200, the RF transmittance and the reception chip structures 2300 and 2400 and the memory chip structure 2500 may be electrically connected to the CPU structure 2100 via the mother board M, the detected temperatures of each semiconductor chip in the chip structures 2100 to 2500 may be transferred to the temperature controller 2230 that may be arranged on the CPU structure 2100.

When the detected temperatures of the semiconductor chips in each of the chip structures 2100 to 2500 and the detected temperature of the case C are compared with the reference temperatures of each of the semiconductor chip in the chip structures 2100 to 2500 and the case C and one of the detected temperatures is higher than the respective reference temperature, the temperature controller 2230 may individually control the operation of each of the semiconductor chips in the chip structures 2100 to 2500, respectively, according to the detected chip temperatures and the detected case temperature. Therefore, the overall temperature of the mobile system 3000 may be accurately controlled according to the detected chip temperatures and the detected case temperature. Particularly, the operation control of each semiconductor chip may be determined by the detected temperature of the case C rather than the assumptive temperature of the case C, thereby sufficiently improving the operation efficiency of each semiconductor chip in the chip structures 2100 to 2500.

According to conventional mobile systems, the temperature of the case cannot be detected directly from the case, and, thus, is usually determined by adding an experimental safety temperature to the detected temperature of the semiconductor chip in the CPU structure, since the dissipating heat from the CPU structure is most plentiful among the dissipating heats from other chip structures. A dynamic temperature management (DTM) tool of the conventional mobile system is operated according to the detected temperature of the semiconductor chip in the CPU structure and the assumptive temperature of the case. Thus, when the assumptive temperature of the case is higher than the reference temperature of the case even though the detected temperature of the semiconductor chip of the CPU structure is sufficiently lower than the reference temperature of the semiconductor chip of the CPU structure, the DTM tool automatically stops the operation of the semiconductor chip of the CPU structure, thereby reducing the operation efficiency of the CPU structure. For example, in a mobile system having a quad-core mobile CPU, the operation efficiency of the CPU structure is known to be reduced to about 20% when the safety temperature is set to be about 10° C.

However, according to the example embodiments of the mobile system in accordance with the example embodiments of the present inventive concepts, the temperature of the case C may be directly detected by the non-contact temperature detector 30 by using the infrared radiant heat from the case C, and, thus, the DTM tool may be operated according to the detected chip temperature of the CPU structure 2100 and also to the detected temperature of the case C rather than the assumptive temperature of the case C. Therefore, an automatic stop of the chip operation of the CPU structure in an allowable temperature range may be minimized to thereby increase the operation efficiency of the CPU structure 2100 of the mobile system 3000.

In the present example embodiment of FIG. 13, the temperature controller 2230 and the non-contact temperature detector 2220 may be arranged in the CPU structure since a relatively larger amount of the operation heat may be generated from the semiconductor chip of the CPU structure. Thus, the DTM process may be efficiently performed in the whole mobile system 3000.

However, the temperature controller 2230 and the non-contact temperature detector 2220 may be arranged at various locations as long as the DTM efficiency is not deteriorated. For example, as shown in FIG. 14, a temperature control chip structure 2700 may be mounted on the mother board M independently from the chip structures 2100 to 2500 rather than the temperature controller 2230 and the non-contact temperature detector 2220 in the CPU structure 2100. The temperature control chip structure 2700 may include an independent temperature controller 2710 and an independent non-contact temperature detector 2720. The chip temperatures of each semiconductor chip in the chip structures 2100 to 2500 may be transferred to the independent temperature controller 2710 via the circuit pattern of the mother board M and the case temperature may be detected by the independent non-contact temperature detector 2720 without making contact with the case C.

According to the mobile system 4000 of FIG. 14, the DTM process of the mobile system 4000 may be conducted according not to the assumptive temperature of the case C but according to the detected temperature of the case C, thereby sufficiently increasing the operation efficiency of the semiconductor chips of the mobile system 4000.

According to the example embodiments of the semiconductor package, the electronic system including the same and the mobile system including the same, the temperature of the housing or case enclosing the semiconductor package may be directly detected by the non-contact temperature detector without making contact with the housing or the case. Thus, the DTM process of the semiconductor package may be conducted according not to an assumptive temperature of the housing or case but to the detected temperature of the housing or the case, thereby sufficiently increasing the operation efficiency of the semiconductor chip of the semiconductor package.

In a conventional application processor (AP) of a mobile system, the case temperature of the mobile system is determined as an assumptive temperature by adding an experimental safety temperature to the detected temperature of the semiconductor chip in the AP. Thus, when the assumptive temperature of the case is higher than the reference temperature of the case even though the detected temperature of the semiconductor chip of the AP is sufficiently lower than the reference temperature of the semiconductor chip of the AP, the DTM tool automatically stops the operation of the semiconductor chip of the CPU structure. Thereby the operation efficiency of the CPU structure in the conventional AP is reducted. However, according to the example embodiments of the mobile system of the present inventive concepts, the temperature of the case may be directly detected by the non-contact temperature detector by using the infrared radiant heat. Thus, the DTM tool of the present inventive concepts may be operated according to the detected chip temperature of the AP and also according to the detected temperature of the case rather than the assumptive temperature of the case. Therefore, in accordance with the present inventive concepts, the automatic stop of the chip operation of the AP in an allowable temperature range may be minimized to thereby increase the operation efficiency of the AP of the mobile system.

The present example embodiments of the memory device of the present inventive concepts may be applied to various electronic systems including semiconductor devices and IC chips such as telecommunication systems and storage systems.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An electronic system comprising:
a package board having an electric circuit pattern;
a semiconductor chip on the package board and electrically connected with the circuit pattern of the package board;
a housing surrounding the package board and the semiconductor chip;
a non-contact temperature detector detecting a temperature of the housing without making contact with the housing; and
a temperature controller controlling the semiconductor chip according to a temperature of the housing that is detected by the non-contact temperature detector.

2. The electronic system of claim 1, wherein the non-contact temperature detector comprises:
an infrared ray (IR) responsive thermocouple generating an electromotive force by absorbing infrared radiant heat emitted from the housing;
a voltmeter connected to the thermocouple and measuring the electromotive force; and
a detecting unit detecting the temperature of the housing from the measured electromotive force.

3. The electronic system of claim 1, further comprising a chip temperature detector detecting a temperature of the semiconductor chip.

4. The electronic system of claim 1, wherein the non-contact temperature detector is integrally provided together with the semiconductor chip in one body.

5. The electronic system of claim 4, further comprising a heat slug positioned on the semiconductor chip and dissipating operation heat of the semiconductor chip outwards, the heat slug having a penetration hole through which the semiconductor chip is partially exposed in such a way that infrared radiant heat emitted from the housing reaches the non-contact temperature detector through the penetration hole.

6. The electronic system of claim 1, wherein the non-contact temperature detector is individually provided on the package board and is separated from the semiconductor chip.

7. The electronic system of claim 6, wherein the non-contact temperature detector comprises a temperature detection chip for detecting the temperature of the housing without making contact with the housing such that the temperature detection chip is positioned on the semiconductor chip and the temperature detection chip and the semiconductor chip are electrically connected through at least a penetration electrode as a chip stack structure.

8. The electronic system of claim 6, further comprising a heat slug positioned on the semiconductor chip and dissipating operation heats of the semiconductor chip outwards and a conductive contact plug electrically connecting the heat slug and the package board, wherein the non-contact temperature detector is positioned on the heat slug.

9. The electronic system of claim 6, further comprising an interposer on the semiconductor chip and electrically connected to the semiconductor chip, wherein the non-contact temperature detector is positioned on the interposer.

10. The electronic system of claim 6, wherein the non-contact temperature detector comprises a temperature detection chip for detecting the temperature of the housing without making contact with the housing such that the temperature detection chip and the semiconductor chip are electrically connected through the circuit pattern of the package board.

11. The electronic system of claim 10, further comprising a heat slug positioned on the semiconductor chip and the temperature detection chip, the heat slug having a penetration hole through which the temperature detection chip is partially exposed in such a way that infrared radiant heat emitted from the housing reaches the temperature detection chip through the penetration hole.

12. An electronic system comprising:
a housing having a receiving space in which a mother board is received; and
a semiconductor package on the mother board, the semiconductor package comprising:
a package board having an electric circuit pattern connected to the mother board;
a semiconductor chip mounted on the package board and electrically connected with the circuit pattern of the package board;
a non-contact temperature detector detecting a temperature of the housing without making contact with the housing; and
a temperature controller controlling the semiconductor chip according to the temperature of the housing that is detected by the non-contact temperature detector.

13. The electronic system of claim 12, wherein the non-contact temperature detector is positioned at at least one of in the semiconductor chip, on an upper surface of the package board and on an upper surface of the semiconductor chip.

14. The electronic system of claim 12, further comprising a heat slug positioned on the semiconductor chip and dissipating operation heats of the semiconductor chip outwards and a conductive contact plug electrically connecting the heat slug and the package board, wherein the non-contact temperature detector is positioned on the heat slug.

15. The electronic system of claim 12, wherein the semiconductor chip includes a chip set for an application process (AP) for a mobile system.

16. An electronic system comprising:
a package board having an electric circuit pattern;
a semiconductor chip on the package board and electrically connected with the circuit pattern of the package board;
a housing surrounding the package board and the semiconductor chip;
a non-contact temperature detector detecting a temperature of the housing, the non-contact temperature detector being spaced apart from the housing; and
a chip temperature detector detecting a temperature of the semiconductor chip.

17. The electronic system of claim 16, further comprising a temperature controller controlling the semiconductor chip according to the temperature of the housing that is detected by the non-contact temperature detector spaced apart from the housing and according to the temperature of the semiconductor chip detected by the chip temperature detector.

18. The electronic system of claim 16, wherein the non-contact temperature detector comprises:
an infrared ray (IR) responsive thermocouple generating an electromotive force by absorbing infrared radiant heat emitted from the housing;

a voltmeter connected to the thermocouple and measuring the electromotive force; and a detecting unit detecting the temperature of the housing from the measured electromotive force.

19. The electronic system of claim 16, further comprising a heat slug positioned on the semiconductor chip and dissipating operation heat of the semiconductor chip outwards, the heat slug having a penetration hole such that infrared radiant heat emitted from the housing reaches the non-contact temperature detector through the penetration hole.

20. The electronic system of claim 16, wherein the non-contact temperature detector is positioned at at least one of in the semiconductor chip, on an upper surface of the package board and on an upper surface of the semiconductor chip.

* * * * *